(12) United States Patent
Ahn

(10) Patent No.: US 6,596,607 B2
(45) Date of Patent: Jul. 22, 2003

(54) METHOD OF FORMING A TRENCH TYPE ISOLATION LAYER

(75) Inventor: Dong-Ho Ahn, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 6 days.

(21) Appl. No.: 09/951,710

(22) Filed: Sep. 14, 2001

(65) Prior Publication Data

US 2002/0072198 A1 Jun. 13, 2002

(30) Foreign Application Priority Data

Dec. 8, 2000 (KR) ........................................ 2000-74837

(51) Int. Cl.[7] .............................................. H01L 21/76
(52) U.S. Cl. ........................ 438/424; 438/221; 438/296; 438/359; 438/424; 438/435; 438/437; 438/700; 438/756; 438/757; 257/510
(58) Field of Search ................................ 438/221, 296, 438/359, 424, 435, 437, 756, 757; 257/510

(56) References Cited

U.S. PATENT DOCUMENTS

| | | | | |
|---|---|---|---|---|
| 5,940,717 A | | 8/1999 | Rengarajan et al. | |
| 6,046,487 A | * | 4/2000 | Benedict et al. | 257/510 |
| 6,146,970 A | * | 11/2000 | Witek et al. | 438/424 |
| 6,146,974 A | * | 11/2000 | Liu et al. | 438/435 |
| 6,333,274 B2 | * | 12/2001 | Akatsu et al. | 438/745 |
| 6,376,893 B1 | * | 4/2002 | Rha | 257/522 |
| 6,479,368 B1 | * | 11/2002 | Mandelman et al. | 438/435 |
| 2001/0036709 A1 | * | 11/2001 | Andrews et al. | 438/424 |

* cited by examiner

Primary Examiner—Matthew Smith
Assistant Examiner—Belur V. Keshavan
(74) Attorney, Agent, or Firm—Lee & Sterba, P.C.

(57) ABSTRACT

A method of forming a trench type isolation layer is provide, wherein the method comprises: forming a trench by etching after forming a trench etching pattern on a substrate; forming a silicon nitride liner on an inner wall of the trench; filling the trench with a first buried oxide layer; exposing an upper part of the liner of the trench by recessing the first buried oxide layer using a wet process; removing the upper part of the silicon nitride liner using isotropic etching; and filling the recessed space of the trench with a second buried oxide layer. The method may further comprise: forming the trench etching pattern by depositing and patterning a silicon nitride layer, and forming a thermal oxide layer, preferably through annealing, for healing etching defects on an inner wall of the trench, between forming the trench and forming the liner.

15 Claims, 5 Drawing Sheets

METHOD OF FORMING A TRENCH TYPE ISOLATION LAYER

BACKGROUND OF THE INVENTION

1. Field of the Invention

The present invention relates to a method of forming a trench type isolation layer. More particularly, the present invention relates to a method of forming a trench type isolation layer having a nitride layer liner wherein an upper part is removed.

2. Description of the Related Art

A trench type isolation, developed to overcome a bird's beak formation problem in a Local Oxidation of Silicon (LOCOS) type isolation, uses a method of filling a trench formed on a substrate with an oxide layer. Accordingly, the bird's beak problem may be eliminated, but problems such as thermal stress caused by a difference in materials between a substrate and an isolation layer materials and a volume expansion caused by a follow-up oxidation of the substrate adjacent to the isolation layer can be created. To solve these problems, a method of forming a silicon nitride liner on an inner wall of a trench before filling with an oxide layer is developed. The silicon nitride liner acts as a barrier preventing the diffusion of oxygen, thereby preventing a substrate adjacent to a trench from being oxidized in a thermal process and thereby reducing stress.

However, the upper part of the silicon nitride liner is etched during the removal of a silicon nitride layer on an active region, which is used as an etch prevention layer, while forming a trench, thereby causing a dent phenomenon. Subsequently, a problem called 'hump' is created when the etched nitride liner region is filled with a polysilicon gate layer.

Moreover, as the silicon nitride layer has a strong tendency of capturing an electron on a surface, an electron is captured when it is moved along a channel with a silicon nitride liner arranged at both sides of the channel of a Metal Oxide Silicon (MOS) transistor, especially at the thermal oxide layer and silicon nitride layer interface. This phenomenon can change the stream of carriers in the channel region. If the channel has a shallow depth and a large width, these problems decrease. However, in the case of a semiconductor device adopting trench isolation, in order to realize a high degree of device integration, the width of the channel is usually narrow, and hence the silicon nitride liner on both sides of the channel actually affects the stream of carriers, especially, if the main carrier is a hole, when source/drain current flows through the channel, as in the case of a p-channel transistor. The actual stream of the holes increases when an electron is captured in the nitride layer of both sides of the channel, resulting in a kind of a hot carrier effect.

Accordingly, a method of removing a silicon nitride liner in the region of actual depth of channel in order to prevent electron capture is proposed in U.S. Pat. No. 5,940,717. This method is briefly described through the drawings of FIG. 1 through FIG. 4.

Referring to FIG. 1, a trench etching mask pattern 13 is formed by depositing and patterning a silicon nitride layer on a substrate 10 where a pad oxide layer 11 is formed. After forming a trench 21, a thermal oxidation of an inner wall of the trench 21 is performed, thereby forming a thermal oxide layer 15. Then, a thin silicon nitride layer is deposited on the entire surface, thereby forming a trench inner wall liner 17. Subsequently, a photoresist layer 19 fills the trench 21 by a spin coating method.

Referring to FIG. 2, an etch back is applied to the photoresist layer 19 which is filling the trench 21, in order to form a recessed residual photoresist layer 29. Ashing is usually performed in an oxygen plasma atmosphere for etch back of photoresist layer 19. The recess process is performed, until the surface level of the residual photoresist layer 29 remains under an effective depth of channel.

Referring to FIG. 3, the exposed silicon nitride liner 17 on the substrate 10 is removed by etching. Usually, the exposed silicon nitride liner is removed by a dry plasma etching, to a depth, up to which the photoresist is removed.

Referring to FIG. 4, the residual photoresist 29 remaining in the trench is removed, and the trench is filled with an oxide isolation layer 39 by a Chemical Vapor Deposition (CVD) method. A surface of the trench etching pattern 13, comprising a silicon nitride layer on an active region, is exposed by planarization using a Chemical Mechanical Polishing (CMP) method. The silicon nitride layer on the active region is then removed by a follow-up wet etching, thereby completing the formation of the trench type isolation layer 39.

However, this method causes damage due the etching of an adjacent layer (i.e., the layer on top of the active region) during recessing photoresist 19 and removing the silicon nitride liner 17 by etching on an upper part of a trench. An uneven height over an entire substrate is generated while a silicon nitride layer 13 in an active region is partially etched, resulting in an irregular level of a device isolation layer in a CMP step of a CVD oxide layer 39. Also, a current leakage may be easily generated in a device to be formed afterward, if an etching defect is created in a trench sidewall.

SUMMARY OF THE INVENTION

It is therefore a feature of an embodiment of the present invention to avoid the conventional problems and prevent the change of a semiconductor device operation by an electron capture of a silicon nitride liner in a trench type isolation and also prevent hot carrier effects.

Another feature of an embodiment of the present invention is to preserve a level of a device isolation layer while partially removing the silicon nitride liner, and to prevent a current leakage adjacent to the trench.

It is yet another feature of an embodiment of the present invention to prevent the oxidation adjacent to a trench by a silicon nitride layer liner, and to provide a method of forming a trench type isolation layer without the problem of a dent.

To provide the above-mentioned features, an embodiment of the present invention provides a method of forming a trench type isolation layer comprising: forming a trench by etching, after forming a trench etching mask pattern on a substrate; forming a silicon nitride liner on an inner wall of the trench; filling the trench with a first buried oxide layer; exposing an upper part of the liner by recessing the first buried oxide layer in the trench with a wet etching process; removing the upper part of the liner using an isotropic etching; and filling the recessed space of the trench with a second buried oxide layer.

Forming a trench etching mask pattern on a substrate is performed by depositing and patterning a silicon nitride layer on a substrate where a pad oxide layer is formed. The method of an embodiment of the present invention further comprises forming a thermal oxide layer, preferably through annealing, for healing etching defects in an inner wall of the trench, between forming a trench and forming a liner. A plasma surface processing step may be performed between forming the liner and filling the trench with a first buried oxide layer to improve gap fill characteristics while reducing dependence of the buried oxide layer on the lower layer. However, as the liner may be easily damaged, the method of an embodiment of the present invention may further comprise depositing a buffer oxide layer like a High Temperature Oxide (HTO) layer by a Low Pressure Chemical Vapor Deposition (LPCVD) over the liner to protect the liner from plasma surface processing damage.

In an embodiment of the present invention, the first buried oxide layer is recessed using a wet process to prevent etching damage to adjacent regions. At this time, it is preferable to perform the recess process until the surface of the first buried oxide layer is lowered below a predetermined depth of channel of a transistor device to be formed afterward, as this may help in preventing electron capture by a silicon nitride liner.

The present invention may be effective in a trench of a p-channel transistor region where electron capture by a silicon nitride liner causes a hot carrier effect. Accordingly, this invention may be preferably applied to p-channel transistor regions.

The present invention may also comprise performing a CMP for a second buried oxide layer and removing the trench etching mask pattern, thereby completing a trench type isolation layer.

These and other features of the present invention will be readily apparent to those of ordinary skill in the art upon review of the detailed description that follows.

BRIEF DESCRIPTION OF THE DRAWINGS

The above and other features and advantages of the present invention will become readily apparent from the description that follows, with reference to the accompanying drawings, in which.

DETAILED DESCRIPTION OF THE PREFERRED EMBODIMENTS

Figure 1:
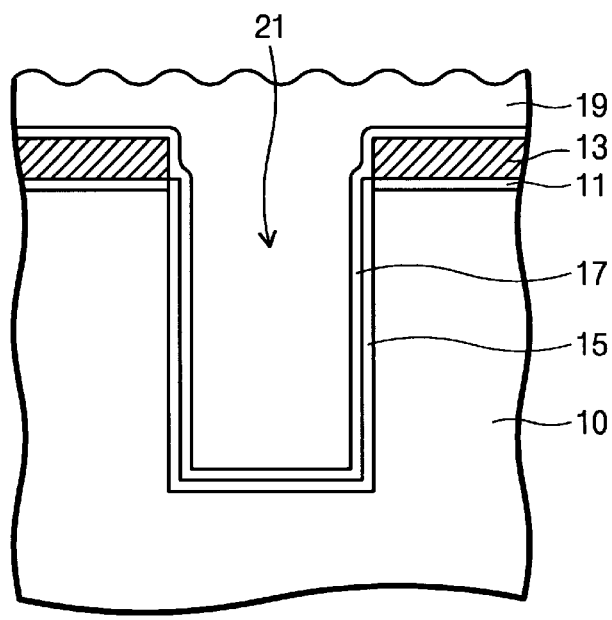
FIGS. 1 through 4 illustrate cross-sectional views explaining the conventional, yet significant, process steps of forming a trench type isolation layer.
Figure 2:
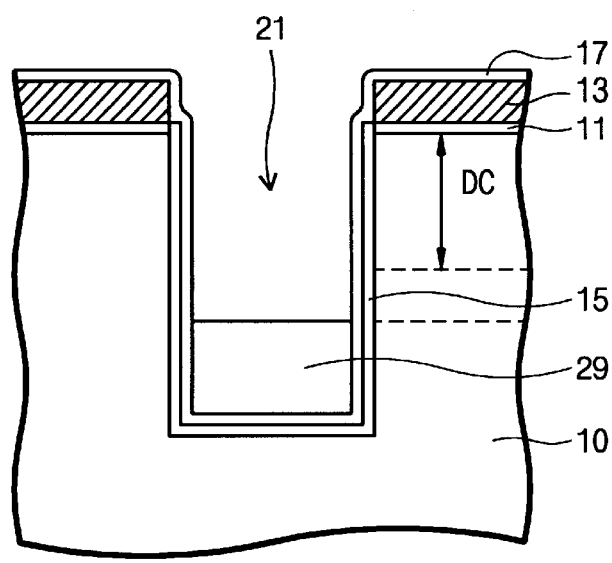
Figure 3:
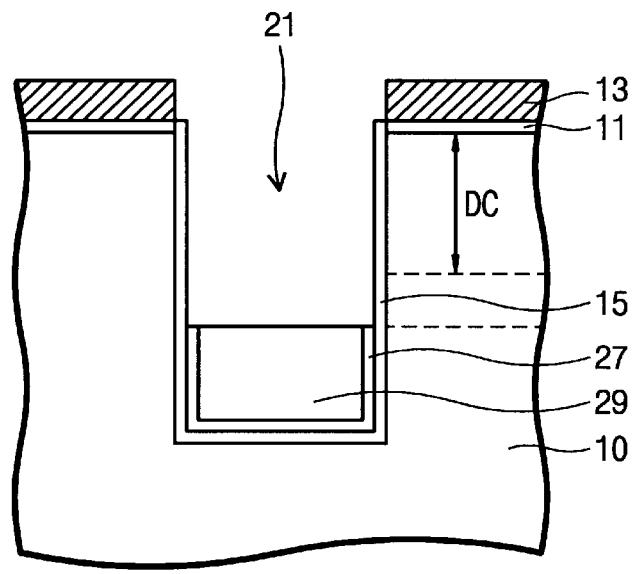
Figure 4:
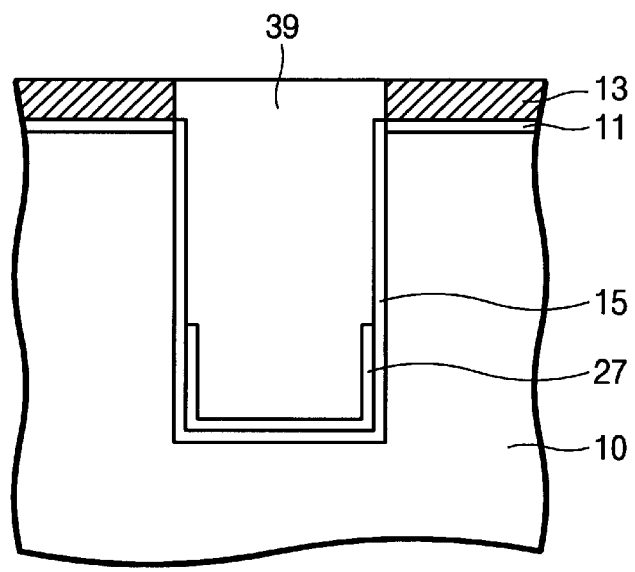

Korean Patent Application No. 2000-74837, filed on Dec. 8, 2001, and entitled "A Method of Forming a Trench Type Isolation Layer," is incorporated by reference herein in its entirety.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those of ordinary skill in the art. In the drawings, the thickness of layers and regions may be exaggerated for clarity. It will also be understood that when a layer is referred to as being "on" another layer or substrate, it may be directly on the other layer or substrate or intervening layers may also be present. Moreover, each embodiment described and illustrated herein includes its complementary conductivity type embodiments as well.

This invention will now be described according to embodiments with reference to the drawings.

Figure 5:
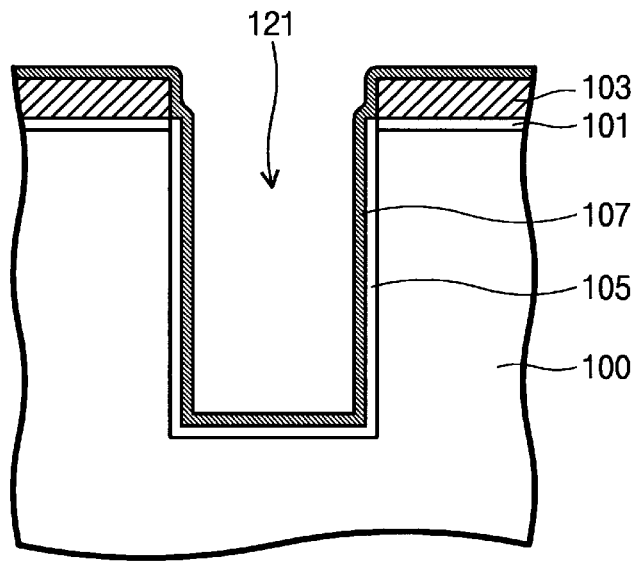
FIGS. 5 through 10 illustrate cross-sectional views explaining the process applied to forming a trench isolation layer in accordance with a preferred embodiment of the present invention.

Referring to FIG. 5, a silicon nitride layer with a thickness of 500 angstroms is deposited and patterned on a silicon substrate 100 where a thin pad oxide layer 101 is formed with a thickness of 100 to 200 angstroms. Then, a trench etching mask pattern 103 exposing the substrate in a trench region is formed. The patterning is achieved by performing a photolithography process and performing an etching for a silicon nitride layer with an etching mask. Next, a thin oxide layer is deposited on a silicon nitride layer, to be used as a hard mask for silicon nitride layer etching.

After the trench etching mask pattern 103 is formed, the substrate 100 is etched to a depth of 2000 to 5000 angstroms, thereby forming a trench 121. A thin oxide layer 105 is formed by thermal oxidation for healing the crystal damage generated in the etching process on the inner wall of the trench. A silicon nitride layer liner 107 is formed by CVD on the substrate where the thermal oxide layer 105 is formed.

Figure 6:
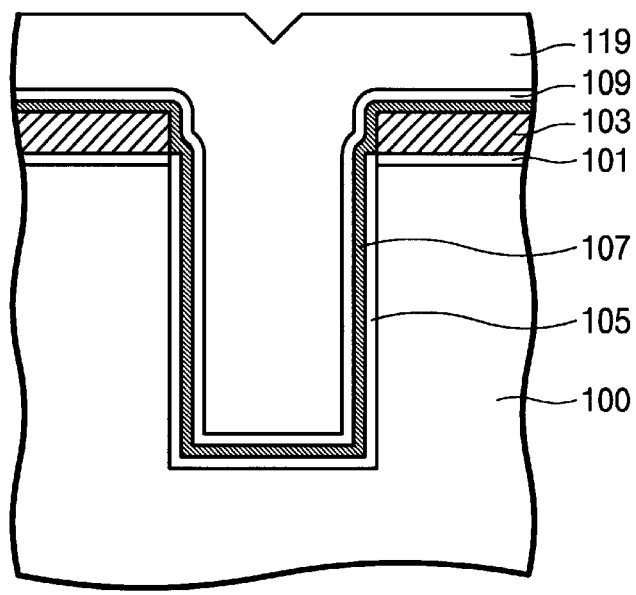

Referring to FIG. 6, a thin High Temperature Oxide (HTO) layer 109 is formed in a Low Pressure Chemical Vapor Deposition (LPCVD) system on the silicon nitride liner 107. The HTO layer 109 is a kind of a buffer oxide layer deposited on the nitride liner 107 before plasma processing. The trench 121 is then filled with a first buried oxide layer 119. An ozone Tetra-Ethyl Ortho-Silicate (TEOS) Undoped Silicate Glass (USG) or Boro-Phospho Silicate Glass (BPSG) oxide layer formed by High Density Plasma Enhanced Chemical Vapor Deposition (HDP CVD) may be used as the first buried oxide layer 119. In this step, a buried oxide layer may not fully fill the trench.

With an increase of an aspect ratio of the trench, a Spin-On-Glass (SOG) layer such as polysilazane may be formed as the first buried oxide layer.

Figure 7:
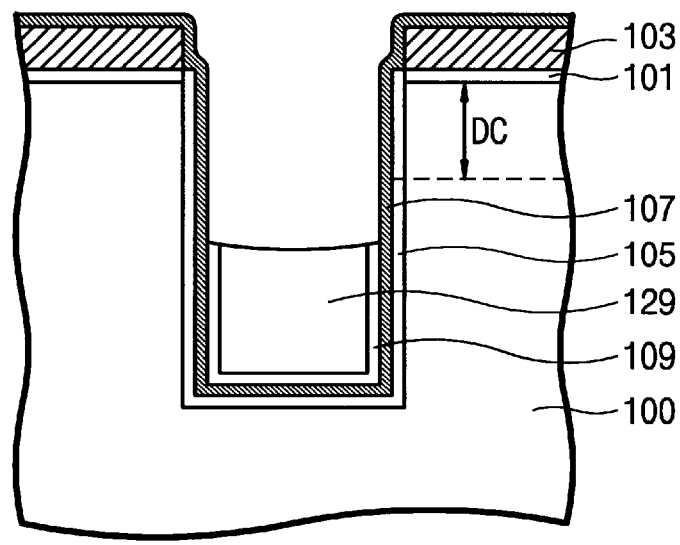

Referring to FIG. 7, the first buried oxide layer 119 can be recessed by a wet etching process. At this stage, an anisotropic etching may cause damage to the sidewall of the trench, therefore a wet etching process is advantageous. Preferably, a recess process for the first buried oxide layer may be used with a predetermined effective depth of channel of a device like a transistor where a residual oxide layer 129 is to be formed at the bottom of the trench in such a way that the surface level of the residual buried oxide layer 129 in the trench is below a predetermined depth of channel. As a result, the silicon nitride layer liner 107 is exposed at levels above the top of the residual oxide layer 129 level in the trench.

When using an SOG layer as a buried oxide layer, a method of removing an upper part of an SOG buried oxide layer by a dry etch processing of the SOG layer before recessing SOG layer with a wet solution etching can be used, instead of a usual wet etching method alone. Curing may be performed for an SOG layer where an upper part is removed.

Figure 8:
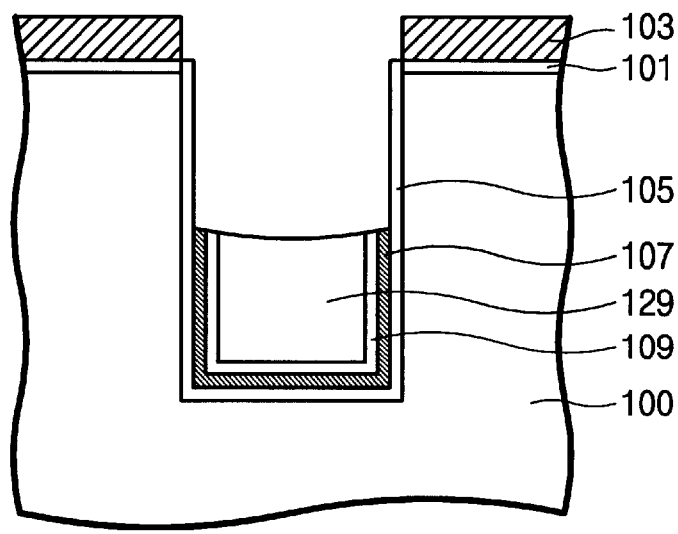

Referring to FIG. 8, an exposed silicon nitride liner 107 is removed by a wet etching solution including a phosphoric acid. Specifically, the liner is completely removed in the trench space where the residual oxide layer 129 does not exist. Besides wet etching, dry isotropic etching can be performed, but a plasma etching or a reactive ion etching (RIE) is not appropriate due to the shape of the liner 107 and the etching defects that it may cause.

Figure 9:
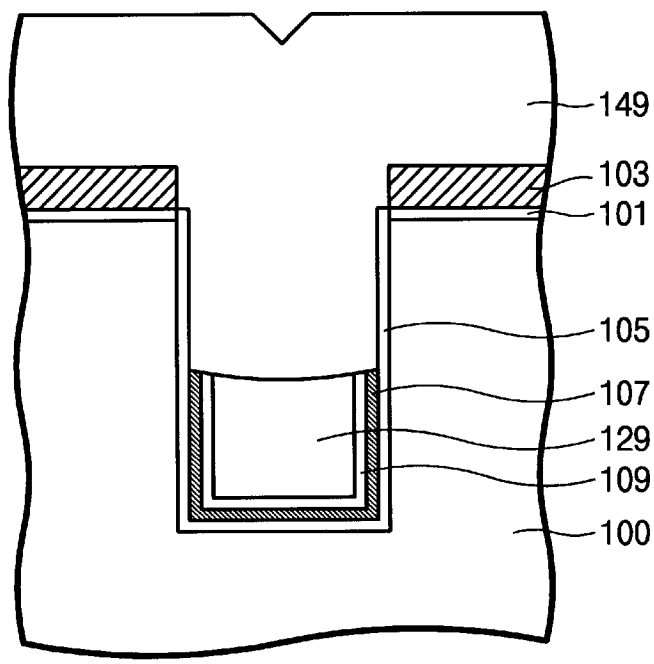

Referring to FIG. 9, a second buried oxide layer 149 is deposited on the substrate wherein the liner is removed at an upper part of the trench. At this stage, the trench is fully filled with a second buried oxide layer. The second buried layer may be formed with the same material and by the same method used for forming the first buried oxide layer, for example, with CVD ozone TEOS USG, CVD BPSG, or SOG layer. Then, an anisotropic etching or a CMP process is performed over the second buried oxide layer 149 until the trench etching mask pattern 103 is exposed, thereby planarizing the second buried oxide layer.

Alternatively, a HDP CVD oxide layer as a second buried oxide layer may be deposited, while simultaneously removing the upper part of liner. This alternate process eliminates separately removing the liner, as in FIG. 8. In a HDP CVD, deposition and etching are alternately repeated, accordingly, the liner is removed and concurrently the second buried oxide layer is deposited.

Figure 10:
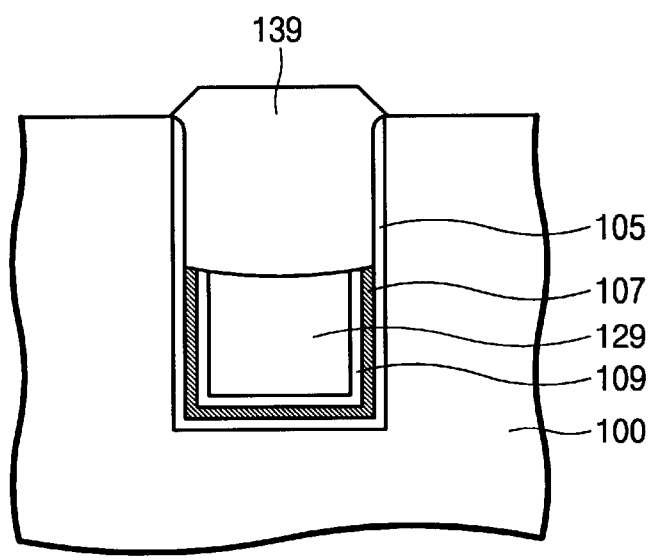

FIG. 10 is an example of a trench type isolation layer formed by an embodiment of the present invention. The silicon nitride layer used as a trench etching mask pattern 103, at the stage of FIG. 9 is removed using wet etching. Therefore, the thermal oxide layer 105 is the only layer left at the upper sidewall surface of a trench in a completed trench type isolation layer before filling the trench with a second buried oxide layer 139. The silicon nitride liner 107, the residual buffer HTO oxide layer 109, and a residual oxide layer 129 of the first buried oxide layer exist in a lower part, and the residual isolation layer 139 exists in an upper part of the trench. It may be noted that most of the isolation layer including the second buried oxide layer 139, the HTO layer 109, the residual first buried oxide layer 129, and the oxide layer 105, except for the residual part of the trench where a silicon nitride liner 107 is formed on the lower part of the inner side of thermal oxide layer 105 in the trench is comprised of oxide layers.

According to an embodiment of the present invention, by intentionally removing an upper part of a silicon nitride liner in the trench, electron capture due to a silicon nitride liner of the trench, and a hot carrier effect thereby, can be prevented in a highly integrated semiconductor device, and the risks of a dent or hump can be removed. Furthermore, trench gap filling performance may be improved by use of a two-step deposition or a combination of coating with an SOG layer and depositing another oxide layer.

Although the control of stress generated by subsequent processes, which is an original purpose for the use of a silicon nitride liner, may be reduced by the removal of an upper part of the silicon nitride liner in the trench, this advantage of the liner still exists in a lower part of the trench and the problem of electron trapping may be eliminated in an upper part of the trench.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of forming a trench type isolation layer, comprising:
   forming a trench etching mask pattern on a substrate;
   forming a trench by etching the substrate with the trench etching mask pattern;
   forming a silicon nitride liner on an inner wall of the trench;
   filling the trench with a first buried oxide layer;
   exposing an upper part of the silicon nitride liner by recessing the first buried oxide layer in the trench with a wet etching process;
   removing the upper part of the silicon nitride liner using an isotropic etching; and
   filling a recessed region of the trench with a second buried oxide layer.

2. The method according to claim 1, wherein forming the trench etching mask pattern on the substrate comprises depositing and patterning a silicon nitride layer on the substrate where a pad oxide layer is formed.

3. The method according to claim 1, further comprises forming a thermal oxide layer for healing etching defects on an inner wall of the trench between forming the trench and forming the silicon nitride liner.

4. The method according to claim 3, wherein the thermal oxide layer is formed through annealing.

5. The method according to claim 1, further comprises depositing a buffer oxide layer on the silicon nitride liner between forming the liner and filling the trench with the first buried oxide layer.

6. The method according to claim 5, wherein the buffer oxide layer on the liner is a High Temperature Oxide (HTO) layer formed in a Low Pressure Chemical Vapor Deposition (LPCVD) system.

7. The method according to claim 1, wherein recessing the first buried oxide layer in the trench by the wet etching process is performed until the surface level of the first buried oxide layer in the trench is lowered below a predetermined depth of channel.

8. The method according to claim 1, wherein removing the upper part of the silicon nitride liner using isotropic etching is performed with a phosphoric acid solution.

9. The method according to claim 1, wherein the trench is confined in a p-channel transistor region.

10. The method according to claim 1, further comprising:
    performing Chemical-Mechanical Polishing (CMP) for the second buried oxide layer; and
    removing the trench etching mask pattern.

11. The method according to claim 1, wherein the first buried oxide layer and the second buried oxide layer are formed by a Chemical Vapor Deposition (CVD) method.

12. The method according to claim 1, wherein at least one of the first buried oxide layer and the second buried oxide layer is formed with a Spin-On-Glass (SOG) layer.

13. The method according to claim 1, wherein removing the upper part of liner is performed simultaneously with filling the recessed region with the second buried oxide layer using a High Density Plasma Enhanced Chemical Vapor Deposition (HDP CVD).

14. The method according to claim 1, wherein the first buried oxide layer is formed with a material selected from the group consisting of Chemical Vapor Deposition (CVD) Ozone Tetra-Ethyl Ortho-Silicate (TEOS) Undoped Silicate Glass (USG) and HDP CVD Boro-Phospho Silicate Glass (BPSG).

15. The method according to claim 1, wherein the second buried oxide layer is formed with a material selected from the group consisting of CVD Ozone TEOS USG and HDP CVD BPSG.

* * * * *